(12) United States Patent
Leme et al.

(10) Patent No.: US 10,416,706 B2
(45) Date of Patent: Sep. 17, 2019

(54) CALIBRATION UNIT FOR CALIBRATING AN OSCILLATOR, OSCILLATOR ARRANGEMENT AND METHOD FOR CALIBRATING AN OSCILLATOR

(71) Applicant: Synopsys, Inc., Mountain View (CA)

(72) Inventors: Carlos Azeredo Leme, Cascais (PT); Adam Burns, Oakville (CA); Dino Toffolon, Stoney Creek (CA)

(73) Assignee: Synopsys, Inc., Mountain View, CA (US)

( * ) Notice: Subject to any disclaimer, the term of this patent is extended or adjusted under 35 U.S.C. 154(b) by 274 days.

(21) Appl. No.: 14/797,117

(22) Filed: Jul. 11, 2015

(65) Prior Publication Data

US 2016/0026209 A1    Jan. 28, 2016

(30) Foreign Application Priority Data

Jul. 22, 2014 (EP) .................................. 14178025

(51) Int. Cl.
   *G06F 1/14*     (2006.01)
   *H03L 1/00*     (2006.01)
   *H03L 7/085*    (2006.01)
(52) U.S. Cl.
   CPC .................. *G06F 1/14* (2013.01); *H03L 1/00* (2013.01); *H03L 7/085* (2013.01)
(58) Field of Classification Search
   CPC .............. G06F 1/14; H03L 1/00; H03L 7/085
   See application file for complete search history.

(56) References Cited

U.S. PATENT DOCUMENTS

| | | | | |
|---|---|---|---|---|
| 7,093,151 B1* | 8/2006 | Williams | .................. | G06F 1/04 713/500 |
| 7,940,876 B2* | 5/2011 | Wang | ........................ | H03L 7/00 370/491 |
| 8,971,423 B1* | 3/2015 | Fu | ........................... | H04K 1/10 327/20 |
| 2003/0174795 A1* | 9/2003 | Bruhnke | .................. | G06F 1/04 375/354 |
| 2007/0079166 A1* | 4/2007 | Okada | .................. | G06F 13/426 713/500 |
| 2007/0216487 A1* | 9/2007 | Yang | ........................ | H03L 7/07 331/1 A |
| 2009/0284298 A1 | 11/2009 | Liu | | |
| 2010/0007392 A1 | 1/2010 | Hsu et al. | | |
| 2010/0313059 A1 | 12/2010 | Wang et al. | | |
| 2012/0002764 A1 | 1/2012 | Hsiao et al. | | |
| 2012/0051479 A1* | 3/2012 | Liu | ........................... | G06F 1/12 375/371 |
| 2012/0056651 A1* | 3/2012 | Shen | ........................ | H03L 7/08 327/156 |
| 2013/0082784 A1 | 4/2013 | Chiu et al. | | |

* cited by examiner

*Primary Examiner* — Jaweed A Abbaszadeh
*Assistant Examiner* — Gayathri Sampath
(74) *Attorney, Agent, or Firm* — Fenwick & West LLP

(57) ABSTRACT

Disclosed is a calibration unit for calibrating an oscillator of a device comprises a counting and comparing unit and a control circuit. The counting and comparing unit is configured to determine a number of periods of a clock signal lying between a starting instance and an ending instance. Therein, the clock signal is generated by the oscillator. The counting and comparing unit is further configured to determine a deviation of the number of periods from a reference number. The control circuit is configured to adjust the oscillator depending on the deviation.

14 Claims, 2 Drawing Sheets

CALIBRATION UNIT FOR CALIBRATING AN OSCILLATOR, OSCILLATOR ARRANGEMENT AND METHOD FOR CALIBRATING AN OSCILLATOR

CROSS REFERENCE TO RELATED APPLICATION

This application claims the right of priority based on European Patent Application No. 14178025.4, filed 22 Jul. 2014, the contents of which is incorporated by reference in its entirety.

BACKGROUND

Field

The disclosure relates to an oscillator arrangement and a calibration unit for calibrating an oscillator, in particular an oscillator for a universal serial bus, universal serial bus (USB) device and to a method for calibrating such an oscillator.

Description of the Art

The USB standard allows plug-and-play interconnection of USB devices to a USB host, such as a computer, a tablet or a smartphone. Such USB devices can be as small as a memory drive, a mouse, a webcam, a microphone or the like. Therefore, USB became ubiquitous as an interconnecting standard, allowing for a high communication speed.

However, a USB device commonly requires an oscillator for example for generating a clock that synchronizes data traffic with the USB host. This clock may for example by required to satisfy a high accuracy. For example, according to USB 2.0 standard, an accuracy of ±500 ppm may be required.

For example due to fabrication process deviations and/or temperature variations, it may be necessary for a fully integrated implementation of such an oscillator to employ a complicated calibration methodology. Conventional calibrated oscillators may require for example calibration at a manufacturing factory using for example measurements at multiple temperatures, which may lead to high costs.

A solution adopted has been to use an oscillator with an external precise resonator, for example a quartz or a ceramic resonator. However, these are commonly bulky external components occupying area and increasing the costs, which may be a serious problem for low cost and miniature USB devices. In addition, the external resonator may require two input/output pins for an off-chip connection. Since many chips are input/output limited, using an external resonator may add additional costs.

Consequently it is desirable to provide an improved concept for calibrating an oscillator, in particular for calibrating an oscillator of a USB device. This objective is achieved by the subject-matter of the independent claims. Further embodiments and implementations are subject-matter of the dependent claims.

BRIEF DESCRIPTION OF THE DRAWINGS

The disclosed embodiments have advantages and features which will be more readily apparent from the detailed description, the appended claims, and the accompanying figures (or drawings). A brief introduction of the figures is below.

Figure (FIG. 1 shows a block diagram of an implementation of an oscillator arrangement according to the improved concept.

DETAILED DESCRIPTION

Figure 1:
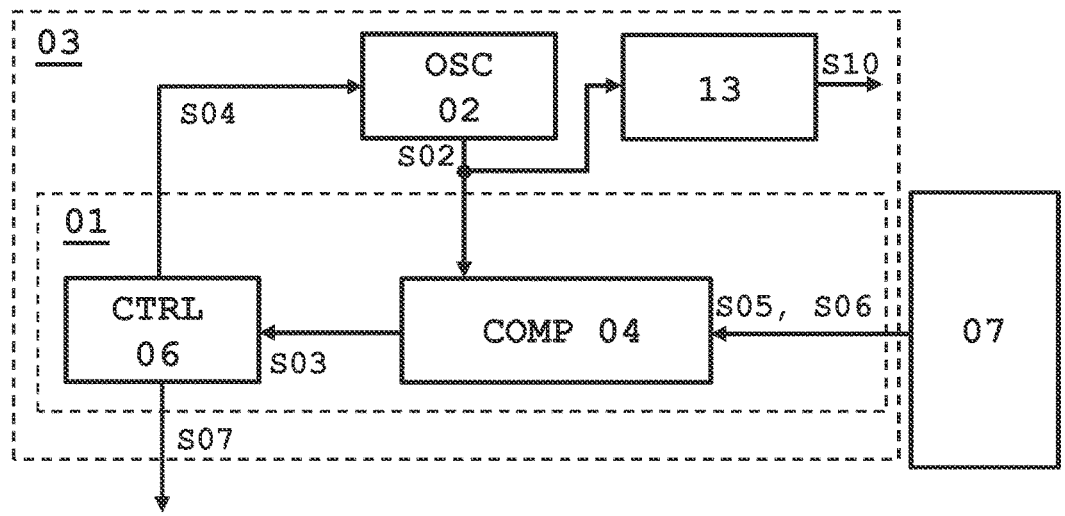

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

The improved concept uses characteristics of a data traffic between a host and a device to calibrate an oscillator of the device. In particular, a number of oscillation periods between characteristic instances in the data traffic is adjusted.

According to the improved concept, a calibration unit for calibrating an oscillator of a device comprises a counting and comparing unit and a control circuit. The counting and comparing unit is configured to determine a number of periods of a clock signal lying between a starting instance and an ending instance. Therein, the clock signal is generated by the oscillator. The counting and comparing unit is further configured to determine a deviation of the number of periods from a reference number. The control circuit is configured to adjust the oscillator depending on the deviation.

Depending on the deviation, a frequency of the clock signal may for example remain unchanged or be increased or decreased, for example by the calibration unit, by the oscillator or by another component comprised by a host and/or the device. For example, the control circuit may be configured to generate a control signal causing the adjustment of the oscillator, in particular the increasing and decreasing of the frequency.

The reference number may for example correspond to an external or internal frequency setting or period setting, respectively, for the oscillator.

The device and the host use for example a protocol for communication, wherein timing information, in particular timing signals, is for example exchanged between the device and the host regularly at a given rate. The timing signals may for example correspond to start-of-frame (SOF) tokens of the protocol. In particular, the device and the host may be a USB device and a USB host, respectively.

In several implementations of the calibration unit the starting instance corresponds to a first point in time when the counting and comparing unit receives a first timing signal from the host. The ending instance corresponds to a second point in time when the counting and comparing unit receives a second timing signal from the host.

In some implementations, for example wherein the device and the host are a USB device and a USB host, respectively, the first timing signal may correspond to a first SOF token and the second timing signal may correspond to a second SOF token. SOF tokens are characteristic data portions transferred at a pre-defined rate from the USB host to the USB device for example during an active state of the USB device. Since said rate of transfer of the SOF tokens may be adjusted and kept constant with high accuracy, the receiving of the first and the second SOF tokens may constitute particularly suitable starting and ending instances for a calibration as explained above.

In particular, the first and the second SOF tokens may be subsequent SOF tokens sent by the USB host. In alternative implementations, the second SOF token may not be the next SOF token following the first SOF token but one or more SOF tokens may be sent by the USB host between the first and the second SOF token.

In some implementations of the calibration unit, the reference number is given by a ratio of a time period between the starting instance and the ending instance and a reference clock period. In particular, in implementations where the starting and ending instances correspond to a first and a second SOF token, the reference number may be given by a ratio of a time period between the device receiving the first and the second SOF token and a reference clock period. The reference clock period may for example correspond to an external or internal setting for the oscillator.

According to other implementations of the calibration unit, the control circuit is further configured to generate a lock indication signal indicating whether the deviation is below a threshold.

In further implementations of the calibration unit, the control circuit is configured to adjust the oscillator by means of determining an error value $E_i$ depending on the deviation and by means of determining a correction value $C_i$ depending on a previous correction value $C_{i-1}$, on the error value $E_i$ and on a previous error value $E_{i-1}$.

According to further implementations of the calibration unit, the correction value $C_i$ is determined according to the relation $STEP_i = STEP_{i-1} * E_{i-1}/(E_{i-1} - E_i)$. Therein $C_i = C_{i-1} + STEP_i$. In particular, correction value $C_i$ may be determined according to the relation $STEP_i = STEP_{i-1} * E_{i-1}/(E_{i-1} - E_i)$ with $C_i = C_{i-1} + STEP_i$.

According to the improved concept also a circuit description representing an implementation of a calibration unit according to the improved concept is provided. The circuit description is stored on a memory device and to be used in a design tool, in particular in an Electronic Design Automation tool.

According to the improved concept also an oscillator arrangement of a device, in particular of a USB device, is provided. Such an oscillator arrangement comprises a calibration unit implemented according to an implementation according to the improved concept and further comprises the oscillator.

In respective implementations of the oscillator arrangement, the oscillator is for example an LC-oscillator. The oscillator may for example be a digitally controlled oscillator, a numerically controlled oscillator, a voltage controlled oscillator, a variable frequency oscillator or another controllable oscillator.

According to several implementations of the oscillator arrangement, the oscillator is configured to increase and to decrease a frequency and/or a period, respectively, of the clock signal depending on the deviation. Depending on the deviation, the oscillator may also leave the frequency unchanged.

According to several implementations of the oscillator arrangement, the oscillator is implemented as a high frequency oscillator and the frequency of the clock signal is higher than a system clock frequency of the USB device.

According to several implementations of the oscillator arrangement, the frequency of the clock signal is equal to or greater than 100 MHz and the system clock frequency of the USB device is smaller than 100 MHz. The system clock frequency is for example equal or approximately equal to 6 MHz, to 12 MHz, to 24 MHz or to 48 MHz.

According to several implementations of the oscillator arrangement, the oscillator arrangement comprises a system clock divider. The system clock divider is configured to generate the system clock signal of the USB device by dividing the clock signal. Therein, the system clock signal has a frequency given by the system clock frequency.

In further implementations of the oscillator arrangement, the device is a USB device, the host is a USB host, the first timing signal corresponds to a first SOF token and the second timing signal corresponds to a second SOF token.

Further implementations of the oscillator arrangement are readily derived from the various implementations and embodiments of the calibration unit and vice versa.

According to the improved concept also a circuit description representing an implementation of a oscillator arrangement according to the improved concept is provided. The circuit description is stored on a memory device and to be used in a design tool, in particular in an Electronic Design Automation tool.

According to the improved concept also a method for calibrating an oscillator of a device, in particular of a USB device, is provided. Thereby, a number of periods of a clock signal generated by the oscillator is determined. In particular the number of periods between a starting instance and a ending instance is determined. Furthermore, a deviation of the number of periods from a reference number is determined. Then the oscillator is adjusted depending on the deviation.

In some implementations of the method, the adjusting of the oscillator includes increasing and decreasing a frequency of the clock signal depending on the deviation.

Further implementations of the method are readily derived from the various implementations and embodiments of the calibration unit and the oscillator arrangement, respectively, and vice versa.

According to the improved concept also a circuit description representing an electronic circuit carrying out an implementation of a method according to the improved concept is provided. The circuit description is stored on a memory device and to be used in a design tool, in particular in an Electronic Design Automation tool.

In the following the invention is explained in detail with the aid of exemplary implementations by reference to the drawings. Components that are functionally identical or have an identical effect may be denoted by identical references. Identical or effectively identical components may be described only with respect to the figure where they occur first, their description is not necessarily repeated in successive figures.

Example Oscillator Arrangement

Figure (FIG. 1 shows a block diagram of an implementation of an oscillator arrangement according to the improved concept. Depicted is a device 03, in particular a USB device 03, coupled to a host 07, in particular a USB host 07. The USB device 03 comprises a calibration unit 01, an oscillator 02 and a system clock divider 13 coupled to the oscillator 02. The calibration unit 01 comprises a counting and comparing unit 04 and a control circuit 06. The counting and comparing unit 04 is for example coupled between the USB host 07 and the control circuit 06. The oscillator 02 is coupled to the counting and comparing unit 04 and to the control circuit 06.

The counting and comparing unit 04 may for example be composed of several components with different functions. For example, the counting and comparing unit 04 may comprise a component for counting and another component for comparing, as described below. Alternatively, the counting and comparing unit 04 or parts of it may also be implemented together with the control circuit 06 into a common component.

The counting and comparing unit 04 determines, in particular counts, a number of periods of the clock signal S02 between a starting instance and an ending instance. For example, the counting and comparing unit 04 receives a first start-of-frame, SOF, token S05 from the USB host at a first point in time corresponding to the starting instance. At a second point in time corresponding to the ending instance, the counting and comparing unit 04 may receive for example a second SOF token S06 from the USB host. Thereby the first and the second SOF token S05, S06 may be but not necessarily are subsequently following each other. That is, there may or may not lie further SOF tokens between the first and the second SOF token S05, S06.

The oscillator 02 generates a clock signal S02 and provides it to the counting and comparing unit 04. Furthermore, the counting and comparing unit 04 determines a deviation S03 by comparing the number of periods to a reference number and for example provides the deviation S03 to the control circuit 06. The reference number may for example be a ratio of a time period between the starting instance and the ending instance and a reference clock period. The reference clock period may for example correspond to a period setting or a frequency setting provided to or stored in the counting and comparing unit 04. Based on the deviation S03, the control circuit may generate a control signal S04 depending on the deviation S03 and provides the control signal S04 to the oscillator 02.

In response to the control signal S04 a frequency and/or a period of the clock signal S02 may for example be increased or decreased or may be left unchanged. In particular, if the control signal S04 indicates that the determined number of periods is larger than the reference number, the frequency may be decreased. Analogously, if the control signal S04 indicates that the determined number of periods is smaller than the reference number, the frequency may be increased. Alternatively, the control signal S04 may also contain direct information about a value of the frequency and/or the period of the clock signal S02 to be set. In this way the oscillator 02 may be calibrated.

As depicted in FIG. 1, the clock signal S02 is commonly not only provided to the counting and comparing unit 04, but for example also to other components of the USB device that may need the clock signal S02 for their operation.

In particular, the oscillator 02 may provide the clock signal S02 to the system clock divider 13. The system clock divider may generate a system clock signal S10 by dividing the clock signal S02. The clock signal S02 has for example a frequency of 100 MHz or more than 100 MHz. By dividing the clock signal S02, a system clock frequency, that is a frequency of the system clock signal S10, may be smaller than the frequency of the clock signal S02. For example, the system clock frequency may be equal or approximately equal to 6 MHz, to 12 MHz, to 24 MHz or to 48 MHz.

For example, according to a USB 2.0 specification, SOF tokens are continuously generated at a pre-defined rate for example during an active mode, that is when a controller of the USB host is in a normal operating state, regardless of other bus activity or lack thereof. A nominal rate is for example once every 1 ms with a tolerance of ±0.0005 ms according to a full-speed specification or once every 125 μs with a tolerance of ±0.0625 μs according to a high-speed specification. According to a high-speed specification a timing accuracy of such signaling is consequently ±0.0625 μs/125 μs=±500 ppm. This corresponds for example to a requirement for accuracy of the clock signal S02 as mentioned earlier. Therefore referring to SOF tokens according to the improved concept provides a suitable means for a calibration of the oscillator 02. Other values and tolerances may apply for USB standards older or newer than USB 2.0, for example for a USB 3.0 standard or other standards. However, the improved concept is generally applicable to any of such standards.

The oscillator 02 may for example typically operate at a frequency of the clock signal S02 in the order of hundreds of MHz, for example of above 100 MHz. Therefore, the described measurement may have an accuracy better than for example ±(1/125 μs)/100 MHz=±80 ppm, lying well below the required accuracy of ±500 ppm. An overall accuracy of the described measurement may then effectively be determined by the accuracy of the SOF rate, namely the required ±500 ppm.

The control circuit 06 may for example employ a locking algorithm in order to generate the control signal S04. The control signal S04 may for example encode a correction value $C_i$ corresponding to a size of an increment or a decrement step, respectively, by which the frequency of the clock signal 02 is adjusted. The correction value $C_i$ depends for example on the magnitude of the deviation S03.

In particular, the control circuit 06 may determine an error value $E_i$ depending on the deviation S03 the correction value $C_i$ depending on a previous correction value $C_{i-1}$, on the error value $E_i$ and on a previous error value $E_{i-1}$. For large deviations, the correction value $C_i$ may be made larger in order to speed-up a locking Thereby locking expresses a state of operation, where the deviation is below a threshold value. On the other hand, for small errors, the step may be made smaller to achieve a higher accuracy.

The locking algorithm may for example also detect if an SOF token got corrupted, which would for example result in a too large deviation S03. In such an occasion, the control circuit 06 may keep the frequency of the clock signal S02 unchanged and wait for a valid measurement to continue the calibration and/or the locking process.

The locking algorithm may for example be further improved by setting a size of the correction value $C_i$ based on the previous error value $E_{i-1}$. In particular, the correction value $C_i$ may be determined according to the equation $$\text{STEP}_i = \text{STEP}_{i-1} * E_{i-1}/(E_{i-1} - E_i) \text{ with } C_i = C_{i-1} + \text{STEP}_i$$

as mentioned earlier.

For example, the described calibration may be carried out continuously during operation of the USB device or during an active mode of the USB device. Alternatively, the calibrations is paused during certain times. For example the calibration may be paused for a certain time after an adjustment of the frequency or when a desired accuracy is achieved.

Figure 2:
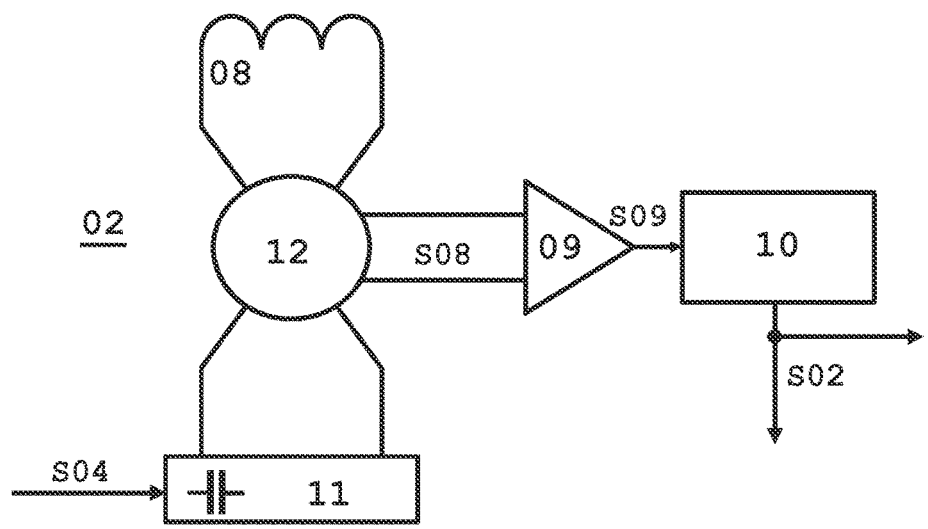
FIG. 2 shows a schematic representation of an oscillator of an oscillator arrangement according to the improved concept.

For example in order to achieve a low jitter, a preferred implementation for the oscillator 02 may be an LC oscillator as shown for example schematically in FIG. 2. The oscillator 02 may for example run at a frequency in the order of GHz, for example 1 GHz or several GHz to allow for complete integration of an inductor 08. Its output may then for example be divided to achieve a frequency of the clock signal S02 in the order of 100 MHz for example by means of a programmable divider 10.

A digitally controlled oscillator with a capacitor bank 11 may be utilized as an oscillator 02. The oscillator 02 may comprise additional control circuits 12 for example for regulating a supply voltage, an oscillation amplitude and/or a common-mode voltage. Furthermore, the oscillator 02 may also comprise a converter 09, for example a differential-to-single-ended converter 09 for converting a pair of internal oscillator signals S08 into a single internal oscillator signal S09.

The calibration unit 01 may for example receive SOF notifications, in particular the first and second SOF tokens S05, S06, from a physical layer, PHY, of the USB device and/or the USB host. The calibration unit 01 may control for example the capacitor bank 11 of the oscillator 02 by means of the control signal S02 as described. When the deviation S03 for example stabilizes at a sufficiently low value, that is below the threshold, the calibration unit 01, for example the control circuit 06, may generate a lock indication signal S07. The threshold may for example correspond to the required accuracy. That is, for above mentioned example of a high-speed USB 2.0 specification, the lock indication signal may indicate whether the deviation corresponds to an accuracy of the clock signal S02 of for example below 500 ppm with respect to the reference clock period.

As an alternative to the digitally controlled oscillator, also a voltage controlled oscillator may be used. In an implementation with a voltage controlled oscillator, a corresponding analog control voltage to control the frequency of the oscillator may be generated by means of a digital-to-analog converter.

By means of implementations according to the improved concept for example the need for an external oscillator in USB devices may be overcome by using a calibration to a characteristic of a USB traffic coming from the USB host, for example SOF tokens. By allowing for an on-chip oscillator, this may reduce costs, size and/or input/output pins required for USB devices.

Characteristics of data transfer in USB systems other than SOF tokens may also be suitable for being used for a calibration according to the improved concept.

Further advantages of the improved concept may comprise achieving a specified accuracy over temperature without requiring measurements at multiple temperatures.

A USB device may comprise more than one oscillator, for example high frequency oscillators, low frequency oscillators, time-keeping oscillators and/or oscillators for clocking a data transfer between the USB host and the USB device. A calibration according to the improved concept as explained herein may analogously be adapted for any oscillator comprised by the USB device. Thereby, an accordingly adapted single calibration unit may be used for all oscillators to be calibrated or for a part of said oscillators. Alternatively, each oscillator to be calibrated may have an individually associated calibration unit according to the improved concept.

In the implementations described with reference to the drawings, the device and the host are referred to as USB device and USB host mostly. It is highlighted that all implementations according to the improved concept are not restricted in this respect. In particular the USB device and the USB host may be replaced by any device and host, respectively, that communicate via a protocol involving sending of timing information, in particular timing signals, from the host to the device in a regular manner as for the case of USB. The timing signal replace the SOF tokens in such implementations.

Example Machine Architecture

The disclosure provided also includes generating a circuit description representing the oscillator arrangement. The circuit description is stored on a memory device of a machine. In addition, that machined includes an electronic design automation tool that uses the circuit description of the oscillator arrangement.

Figure 3:
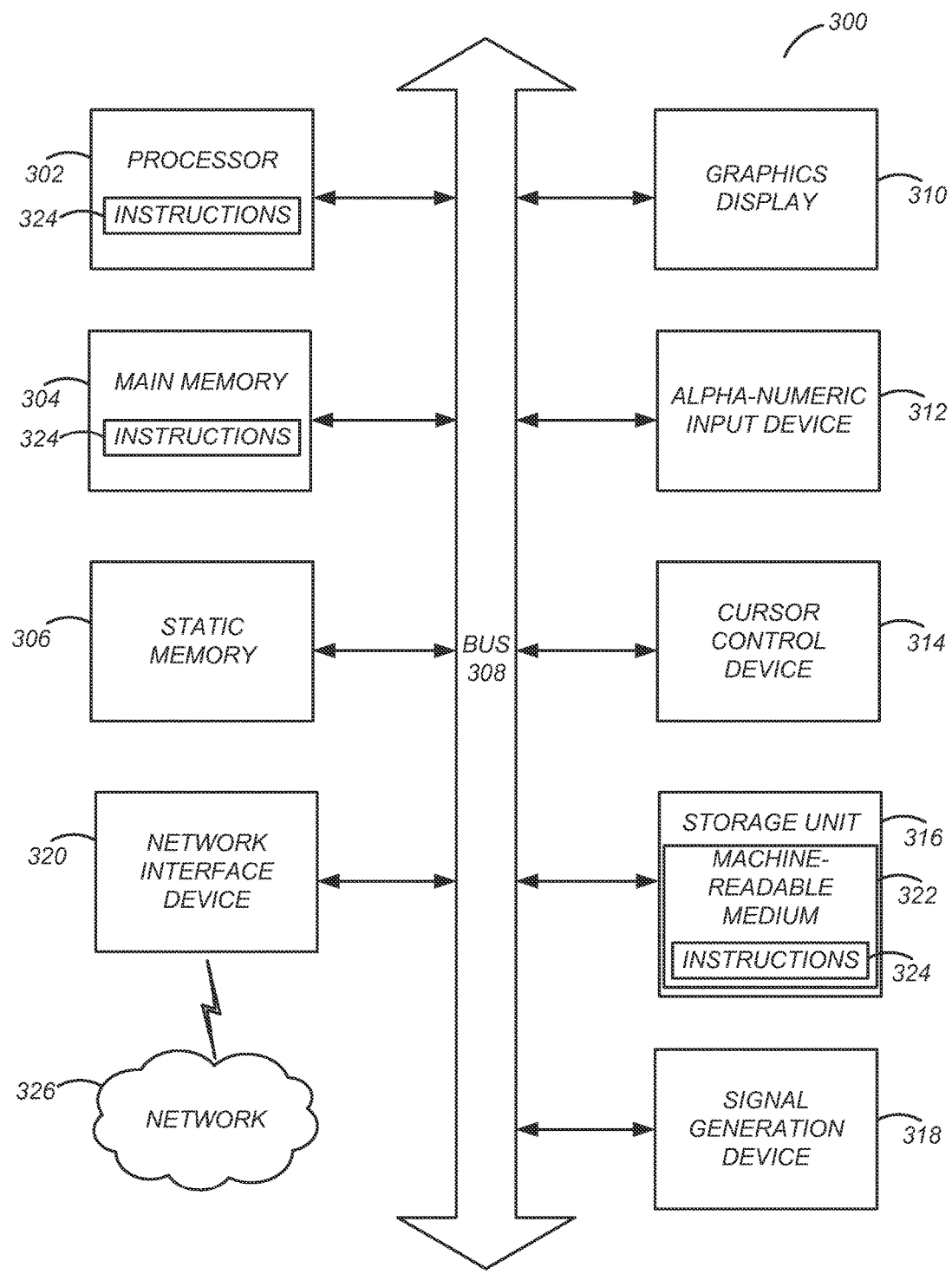
FIG. 3 is a block diagram illustrating components of an example machine able to read instructions from a machine-readable medium and execute them in a processor (or controller).

The FIG. 3 is a block diagram illustrating components of an example machine able to read instructions from a machine-readable medium and execute them in a processor (or controller). Specifically, FIG. 3 shows a diagrammatic representation of a machine in the example form of a computer system 300. The computer system 300 can be used to execute instructions 324 (e.g., program code or software) for causing the machine to perform any one or more of the methodologies (or processes) described herein. In alternative embodiments, the machine operates as a standalone device or a connected (e.g., networked) device that connects to other machines. In a networked deployment, the machine may operate in the capacity of a server machine or a client machine in a server-client network environment, or as a peer machine in a peer-to-peer (or distributed) network environment. It is noted that the software may be an electronic design automation tool and can be used with the circuit description of the oscillator as described in the configurations herein.

The machine may be a server computer, a client computer, a personal computer (PC), a tablet PC, a set-top box (STB), a smartphone, an internet of things (IoT) appliance, a network router, switch or bridge, or any machine capable of executing instructions 324 (sequential or otherwise) that specify actions to be taken by that machine. Further, while only a single machine is illustrated, the term "machine" shall also be taken to include any collection of machines that individually or jointly execute instructions 324 to perform any one or more of the methodologies discussed herein.

The example computer system 300 includes one or more processing units (generally processor 302). The processor 302 is, for example, a central processing unit (CPU), a graphics processing unit (GPU), a digital signal processor (DSP), a controller, a state machine, one or more application specific integrated circuits (ASICs), one or more radio-frequency integrated circuits (RFICs), or any combination of these. The computer system 300 also includes a main memory 304. The computer system may include a storage unit 316. The processor 302, memory 304 and the storage unit 316 communicate via a bus 308.

In addition, the computer system 306 can include a static memory 306, a display driver 310 (e.g., to drive a plasma display panel (PDP), a liquid crystal display (LCD), or a projector). The computer system 300 may also include alphanumeric input device 312 (e.g., a keyboard), a cursor control device 314 (e.g., a mouse, a trackball, a joystick, a motion sensor, or other pointing instrument), a signal generation device 318 (e.g., a speaker), and a network interface device 120, which also are configured to communicate via the bus 308.

The storage unit 316 includes a machine-readable medium 322 on which is stored instructions 324 (e.g., software) embodying any one or more of the methodologies or functions described herein. The instructions 324 may also reside, completely or at least partially, within the main memory 304 or within the processor 302 (e.g., within a processor's cache memory) during execution thereof by the computer system 300, the main memory 304 and the processor 302 also constituting machine-readable media. The instructions 324 may be transmitted or received over a network 326 via the network interface device 320.

While machine-readable medium 322 is shown in an example embodiment to be a single medium, the term "machine-readable medium" should be taken to include a single medium or multiple media (e.g., a centralized or distributed database, or associated caches and servers) able to store the instructions 324. The term "machine-readable medium" shall also be taken to include any medium that is capable of storing instructions 324 for execution by the machine and that cause the machine to perform any one or more of the methodologies disclosed herein. The term "machine-readable medium" includes, but not be limited to, data repositories in the form of solid-state memories, optical media, and magnetic media.

What is claimed is:

1. An oscillator arrangement comprising an oscillator of a universal serial bus (USB) device and a calibration unit for calibrating the oscillator, the calibration unit comprising:
   a counting and comparing unit configured to determine a number of periods of a clock signal generated by the oscillator between a starting instance and an ending instance, and to determine a deviation of the number of periods from a reference number; and
   a control circuit configured to adjust the oscillator responsive to the deviation, wherein a frequency of the clock signal generated by the oscillator is higher than a system clock frequency of the USB device,
      wherein the control circuit is configured to adjust the oscillator by means of determining an error value $E_i$ depending on the deviation and by means of determining a correction value $C_i$ depending on a previous correction value $C_{i-1}$ on the error value $E_i$ and on a previous error value $E_{i-1}$,
      and wherein the correction value $C_i$ is determined according to a relation of the form $STEP_i = STEP_{i-1} * E_{i-1}/(E_{i-1}-E_i)$ with $C_i = C_{i-1} + STEP_i$,
      and wherein the frequency of the clock signal generated by the oscillator is equal to or greater than 100 MHz and the system clock frequency of the USB device is less than 100 MHz.

2. The oscillator arrangement according to claim 1, wherein
   the starting instance corresponds to a first point in time when the counting and comparing unit receives a first timing signal corresponding to a first start-of-frame (SOF) token from a USB host; and
   the ending instance corresponds to a second point in time when the counting and comparing unit receives a second timing signal corresponding to a second SOF token from the USB host.

3. The oscillator arrangement according to claim 1, wherein the reference number is given by a ratio of a time period between the starting instance and the ending instance and a reference clock period.

4. The oscillator arrangement according to claim 1, wherein the control circuit is further configured to generate a lock indication signal indicating whether the deviation is below a threshold.

5. The oscillator arrangement according to claim 1, wherein the oscillator is an LC oscillator, a digitally controlled oscillator or a voltage controlled oscillator.

6. The oscillator arrangement according to claim 1, wherein the oscillator is configured to increase and to decrease a frequency of the clock signal depending on the deviation.

7. The oscillator arrangement according to claim 6, wherein the increasing or decreasing of the frequency is carried out by means of adjusting a setting of a capacitor bank comprised by the oscillator.

8. The oscillator arrangement according to claim 1, further comprising a system clock divider configured to generate a system clock signal of the USB device by dividing the clock signal.

9. A method for calibrating an oscillator of a universal serial bus (USB) device wherein the method comprises:
   determining a number of periods of a clock signal generated by the oscillator between a starting instance and an ending instance;
   determining a deviation of the number of periods from a reference number; and
   adjusting the oscillator depending on the deviation, wherein the control circuit is configured to adjust the oscillator by means of determining an error value $E_i$ depending on the deviation and by means of determining a correction value $C_i$ depending on a previous correction value $C_{i-1}$, on the error value $E_i$ and on a previous error value $E_{i-1}$ and wherein the correction value $C_i$ is determined according to a relation of the form $STEP_i = STEP_{i-1} * E_{i-1}/(E_{i-1}-E_i)$ with $C_i = C_{i-1} + STEP_i$, and wherein a frequency of the clock signal generated by the oscillator is higher than a system clock frequency of the USB device, and wherein the frequency of the clock signal is equal to or greater than 100 MHz and the system clock frequency of the USB device is smaller than 100 MHz.

10. The method according to claim 9, wherein the adjusting is performed by increasing and by decreasing a frequency of the clock signal depending on the deviation.

11. The method according to claim 9, wherein
   the starting instance corresponds to a first point in time when a first timing signal corresponding to a first start of frame (SOF) token is received by the USB device from a USB host; and
   the ending instance corresponds to a second point in time when a second timing signal corresponding to a second SOF token is received by the USB device from the USB host.

12. The method according to claim 9, further comprising generating a system clock signal of the USB device by dividing the clock signal.

13. A circuit description representing an oscillator arrangement, the circuit description stored on a memory device and to be used in an electronic design automation tool, the circuit description of the oscillator arrangement comprising an oscillator of a universal serial bus (USB) device and a calibration unit for calibrating the oscillator, the calibration unit comprising:
   a counting and comparing unit configured
   to determine a number of periods of a clock signal generated by the oscillator between a starting instance and an ending instance, and
   to determine a deviation of the number of periods from a reference number; and
   a control circuit configured to adjust the oscillator depending on the deviation, wherein a frequency of the clock signal generated by the oscillator is higher than a system clock frequency of the USB device, and wherein the control circuit is configured to adjust the oscillator by means of determining an error value $E_i$ depending on the deviation and by means of determining a correction value $C_i$ depending on a previous correction value $C_{i-1}$, on the error value $E_i$ and on a previous error value $E_{i-1}$, and wherein the correction value $C_i$ is determined according to a relation of the form $STEP_i=STEP_{i-1}*E_{i-1}/(E_{i-1}-E_i)$ with $C_i=C_{i-1}+STEP_i$, and wherein the frequency of the clock signal generated by the oscillator is equal to or greater than 100 MHz and the system clock frequency of the USB device is less than 100 MHz.

14. A circuit description representing an oscillator arrangement for calibrating an oscillator of a universal serial bus (USB) device, the circuit description stored on a memory device and to be used in an electronic design automation tool to:

determine a number of periods of a clock signal generated by the oscillator between a starting instance and a ending instance;

determine a deviation of the number of periods from a reference number; and adjust the oscillator depending on the deviation, wherein the control circuit is configured to adjust the oscillator by means of determining an error value E depending on the deviation and by means of determining a correction value $C_i$ depending on a previous correction value $C_{i-1}$, on the error value $E_i$ and on a previous error value $E_{i-1}$, and wherein the correction value $C_i$ is determined according to a relation of the form $STEP_i=STEP_{i-1}*E_{i-1}/(E_{i-1}-E_i)$ with $C_i=C_{i-1}+STEP_i$, and wherein a frequency of the clock signal generated by the oscillator is higher than a system clock frequency of the USB device, and wherein the frequency of the clock signal is equal to or greater than 100 MHz and the system clock frequency of the USB device is less than 100 MHz.

* * * * *